United States Patent
Mnich

(10) Patent No.: US 6,346,839 B1
(45) Date of Patent: Feb. 12, 2002

(54) LOW POWER CONSUMPTION INTEGRATED CIRCUIT DELAY LOCKED LOOP AND METHOD FOR CONTROLLING THE SAME

(75) Inventor: Thomas Michael Mnich, Woodland Park, CO (US)

(73) Assignee: Mosel Vitelic Inc., Hsinchu (TW)

( * ) Notice: Subject to any disclaimer, the term of this patent is extended or adjusted under 35 U.S.C. 154(b) by 0 days.

(21) Appl. No.: 09/542,509

(22) Filed: Apr. 3, 2000

(51) Int. Cl.$^7$ .................................................. H03L 7/06
(52) U.S. Cl. ........................ 327/158; 327/149; 327/153; 327/161; 331/14; 331/DIG. 2; 365/189.07; 365/233; 375/376
(58) Field of Search .............................. 327/141, 147, 327/149, 150, 153, 155, 156, 158, 161, 162, 163; 365/233, 233.5, 189.07, 189.09; 375/373, 376; 331/1 A, 25, DIG. 2

(56) References Cited

U.S. PATENT DOCUMENTS 5,790,612 A * 8/1998 Chengson et al. .......... 375/373
6,087,868 A * 7/2000 Millar ........................ 327/156

OTHER PUBLICATIONS

A Low–Power CMOS Time–to–Digital Converter, IEEE Journal of Solid–State Circuits, vol. 30, No. 9, Raisanen–Ruotsalainen et al., 9/95.

Clock Buffer Chip with Multiple Target Automatic Skew Compensation, IEEE Journal of Solid–State Circuits, vol. 30, No. 11, Watson, Jr. & Iknaian, 11/95.

A 64–Mbit, 640–MByte/s Bidirectional Data Strobed, Double–Data–Rate SDRAM with a 40–mW DLL for a 256–MByte Memory System, IEEE Journal of Solid–State Circuits, vol. 33, No. 11, Kim et al., 11/98.

The Delay Vernier Pattern Generation Technique, IEEE Journal of Solid–State Circuits, vol. 32, No. 4, Moyer et al. 4/97.

A Portable Clock Multiplier Generator Using Digital CMOS Standard Cells, IEEE Journal of Solid–State Circuits, vol. 31, No. 7, Combes et al., 7/96.

A 250–622 MHz Deskew and Jitter–Suppressed Clock Buffer Using Two–Loop Architecture, IEEE Journal of Solid–State Circuits, vol. 31, No. 4, Tanoi, 4/96.

An Integrated High Resolution CMOS Timing Generator Based on Array of Delay Locked Loops, IEEE Journal of Solid–State Circuits, vol. 31, No. 7, Christainsen, 7/96.

A 800MB/s 72Mb SLDRAM with Digitally–Calibrated DLL, IEEE Journal of Solid–State Circuits Conference/Session 24/Paper WP24.3, Paris et al., 6/99.

* cited by examiner

Primary Examiner—Timothy P. Callahan
Assistant Examiner—Minh Nguyen
(74) Attorney, Agent, or Firm—William J. Kubida; Kent A. Lembke; Hogan & Hartson LLP

(57) ABSTRACT

A low power consumption delay locked loop for integrated circuit devices wherein a wider frequency range of operation is achieved by matching the delay of the clock comparison function of the phase detector to the slow operating condition of the programmable delay. In a particular embodiment, this may be effectuated by incorporating at least one additional flip-flop section in the phase detector circuit and more than one such section may be utilized depending on the operating targets of maximum frequency and frequency range. By latching the phase detector outputs through the use of a fast/slow latch circuit, a minimum control pulse is defined which allows a unitized change on the voltage signals that control the programmable delay in a voltage controlled delay line. This also improves efficiency and reduces power consumption by eliminating switching current through transistors that control the voltage levels determining the programmable delay.

15 Claims, 4 Drawing Sheets

LOW POWER CONSUMPTION INTEGRATED CIRCUIT DELAY LOCKED LOOP AND METHOD FOR CONTROLLING THE SAME

CROSS REFERENCE TO RELATED PATENT APPLICATIONS

The present invention is related to the subject matter disclosed in U.S. patent applications Ser. No. 09/541,876 for: "System and Method of Compensating for Non-Linear Voltage-to-Delay Characteristics in a Voltage Controlled Delay Line" and U.S. Ser. No. 09/542,511 for: "System and Method for Eliminating Pulse Width Variations in Digital Delay Lines", both filed on even date herewith and assigned to Mosel Vitelic, Inc., assignee of the present invention, the disclosures of which arc specifically incorporated herein by this reference.

BACKGROUND OF THE INVENTION

The present invention relates, in general, to the field of integrated circuit ("IC") delay locked loops ("DLL"). More particularly, the present invention relates to an integrated circuit delay locked loop design and method for controlling the same of especial utility in double data rate ("DDR") dynamic random access memory ("DRAM") devices, static random access memory ("SRAM") devices, integrated circuit ("IC") processors and other IC devices.

DDR DRAM device functionality is specified by a Joint Electron Devices Engineering Counsel ("JEDEC") standard and such memories are able to achieve this effective doubling of the device's bandwidth by inclusion of DLL circuitry to achieve synchronization of data accesses at a point in time to enable the reading of data on both the rising and falling edges of each clock cycle. In such DLL circuits, a phase detector is utilized to determine the relative phase between two clock signals, such as the system clock and synchronization ("sync") clock signal in a DDR memory device.

In certain delay locked loops, the frequency range for locking of the loop can be limited by power supply voltage levels because the reference clock comparison is not matched to the total delay in the programmable delay section. Moreover, the generation of controlling voltages for the programmable delay portion of the loop can be limited by the overlap of phase detector outputs.

SUMMARY OF THE INVENTION

Disclosed herein is a low power consumption phase locked loop for integrated circuit devices wherein a wider frequency range of operation is achieved by matching the delay of the clock comparison function of the phase detector to the slow operating condition of the programmable delay. In a particular embodiment disclosed herein, this may be effectuated by incorporating at least one additional flip-flop section in the phase detector circuit and more than one such section may be utilized depending on the operating targets of maximum frequency and frequency range. Operationally, the primary point of interest is at power up or reset bias conditions.

By latching the phase detector outputs through the use of a fast/slow latch circuit, a minimum control pulse is defined which allows a unitized change on the voltage signals that control the programmable delay in a voltage controlled delay line. This also improves efficiency and reduces power consumption by eliminating switching current through transistors that control the voltage levels determining the programmable delay.

Functionally, the first two reference clock pulses on the CLOCK input to the phase detector are effectively ignored through the use of the flip-flop section. This results in a programmable delay change in a slower direction for most operating conditions in order to achieve lock and, overall, effectively improves the range of frequencies for which lock can be achieved. The phase detector outputs are logically exclusive OR'd then latched by a fast/slow latch circuit to provide clean digital "speed up"or "slow down" signals to the delay voltage control circuit. By eliminating the conventional overlap of these inputs to the delay voltage control circuit, only one directional change (i.e. "speed up" or "slow down") occurs per cycle. This eliminates the potential for excessive, or wasted, current consumption caused when overlapping signals are used while also allowing the control voltages to go all the way to supply or circuit ground levels.

Particularly disclosed herein is a delay locked loop circuit which comprises a phase detector coupled to receive first and second clocking signals and producing at least one output signal indicative of a phase relationship between the first and second clocking signals. A latch circuit is coupled to receive the output signal and produces at least one fast/slow signal in response thereto. A voltage controlled delay line is coupled to receive the fast/slow signal and produce the second clocking signal for input to the phase detector.

Also disclosed herein is a method for operating a delay locked loop comprising the steps of: inputting a first clock signal to the delay locked loop; comparing the phase of the first clock signal to the phase of a second clock signal; producing at least one output signal indicative of the phase relationship between the first and second clock signals; latching the output signal to provide at least one fast/slow signal in response thereto and controlling a delay line in response to the fast/slow signal to produce the second clock signal.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A PREFERRED EMBODIMENT

Figure 1:
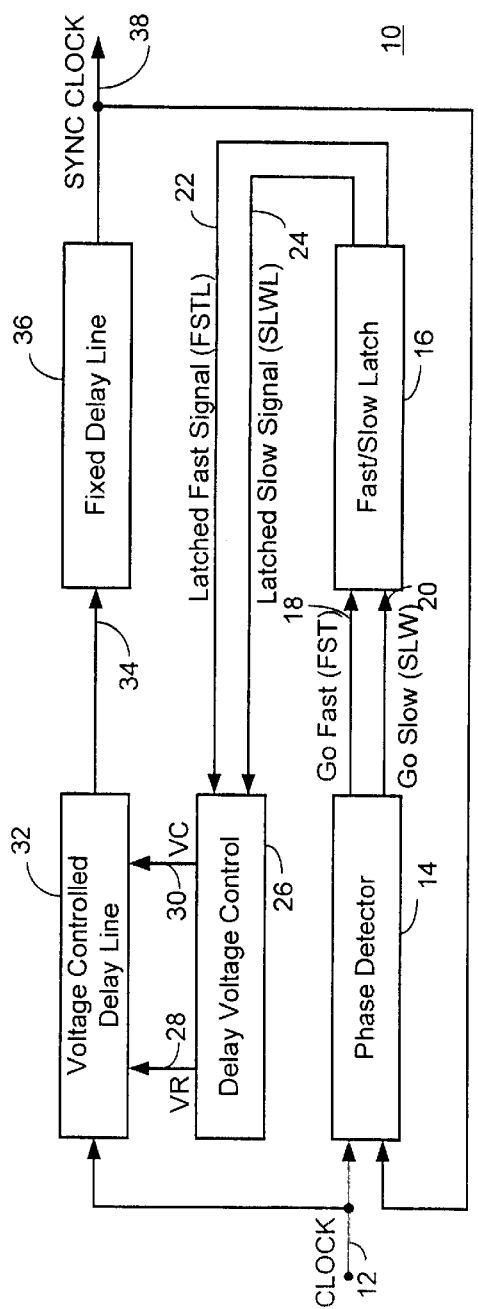
FIG. 1 is a simplified logic block diagram of a delay locked loop ("DLL") circuit for use, for example, in a double data rate ("DDR") dynamic random access memory ("DRAM") device.

With reference now to FIG. 1, a simplified logic block diagram of a delay locked loop ("DLL") circuit 10 is shown for use, for example, in a double data rate ("DDR") dynamic random access memory ("DRAM") device. The DLL circuit 10 receives a clock signal input on line 12 forming one input to a phase detector 14. The phase detector 14 provides inputs to a fast/slow latch circuit 16 in the form of a "Go Fast" ("FST") signal on line 18 and a "Go Slow" ("SLW") signal on line 20.

In turn, the fast/slow latch circuit 16 provides a latched fast signal ("FSTL") on line 22 and latched slow signal ("SLWL") on line 24 for input to a delay voltage control circuit 26. The delay voltage control circuit 26 provides a VR signal on output line 28 and VC signal on output line 30 for input to a voltage controlled delay line circuit 32. The voltage controlled delay line circuit 32 supplies a signal on line 34 for input to a fixed delay line circuit 36 which provides a synchronous ("sync") clock output on line 38 which is also fed back to a second input of the phase detector 14. The voltage controlled delay line circuit 32 is disclosed in more detail in the aforementioned co-pending patent application.

In operation, the phase detector 14 determines the relative phase between the clock signal on line 12 and the sync clock signal on line 38 and adjusts the control voltages VC and VR going to the voltage controlled delay line circuit 32 until the two clock signals are in phase. The fast/slow latch circuit 16 generates a pulse on one of the latched signal lines 22, 24 when a delay adjustment is required that is used to make adjustments to the control voltages VC and VR. The width of this pulse varies with the magnitude of the phase difference between the clock and sync clock signals such that the changes are larger when the phase difference is large and smaller when the difference becomes smaller.

Figure 2:
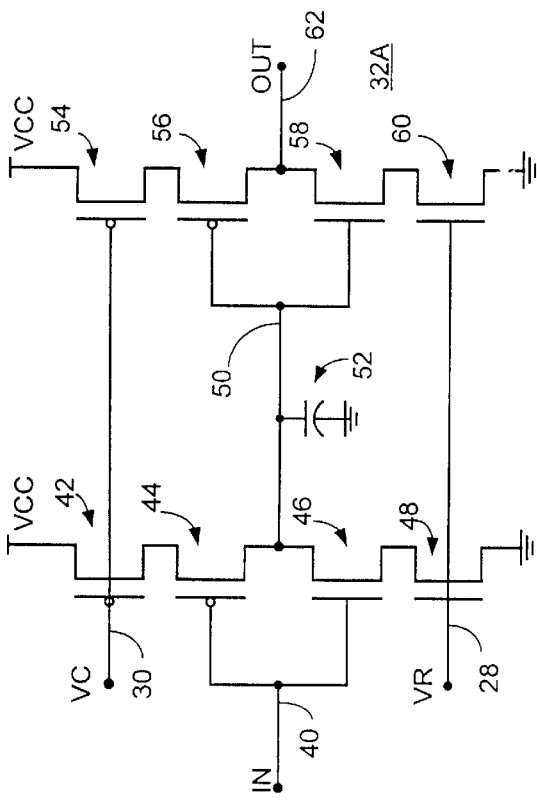
FIG. 2 is a detailed schematic diagram of a voltage controlled delay inverter circuit forming a portion of the voltage controlled delay line circuit of the DLL circuit of FIG. 1.

With reference additionally now to FIG. 2, a schematic diagram of a voltage controlled delay inverter circuit 32A is illustrated forming a portion of the voltage controlled delay line circuit 32 of the DLL circuit 10 of FIG. 1. In a particular embodiment of the present invention for use, for example, in a 64Meg DDR DRAM memory device, twenty series connected voltage control delay inverter circuits 32A may be used to form the voltage controlled delay line circuit 32 while twenty four fixed delay circuits may be used to form the fixed delay line circuit 36.

Each of the voltage controlled delay inverter circuits 32A receives the VC and VR control voltage signals as inputs on lines 30 and 28 respectively. An input to each successive one of the circuits 32A is received on line 40. The circuits 32A comprise a pair of series connected CMOS transistors strings comprising P-channel transistors 42 and 44 coupling a supply voltage ("VCC") to circuit ground through N-channel transistors 46 and 48. Similarly, P-channel transistors 54 and 56 couple VCC to circuit ground through N-channel transistors 58 and 60.

The VC signal on line 30 is supplied to the gate terminals of P-channel transistors 42 and 54 while the VR signal on line 28 is supplied to the gate terminals of N-channel transistors 48 and 60. The input line 40 is coupled to the common connected gate terminals of P-channel transistor 44 and N-channel transistor 46. Node 50 intermediate P-channel transistor 44 and N-channel transistor 46 is coupled to the common connected gate terminals of P-channel transistor 56 and N-channel transistor 58. The output of the circuit 32A is taken at a node 62 intermediate P-channel transistor 56 and N-channel transistor 58.

Figure 3:
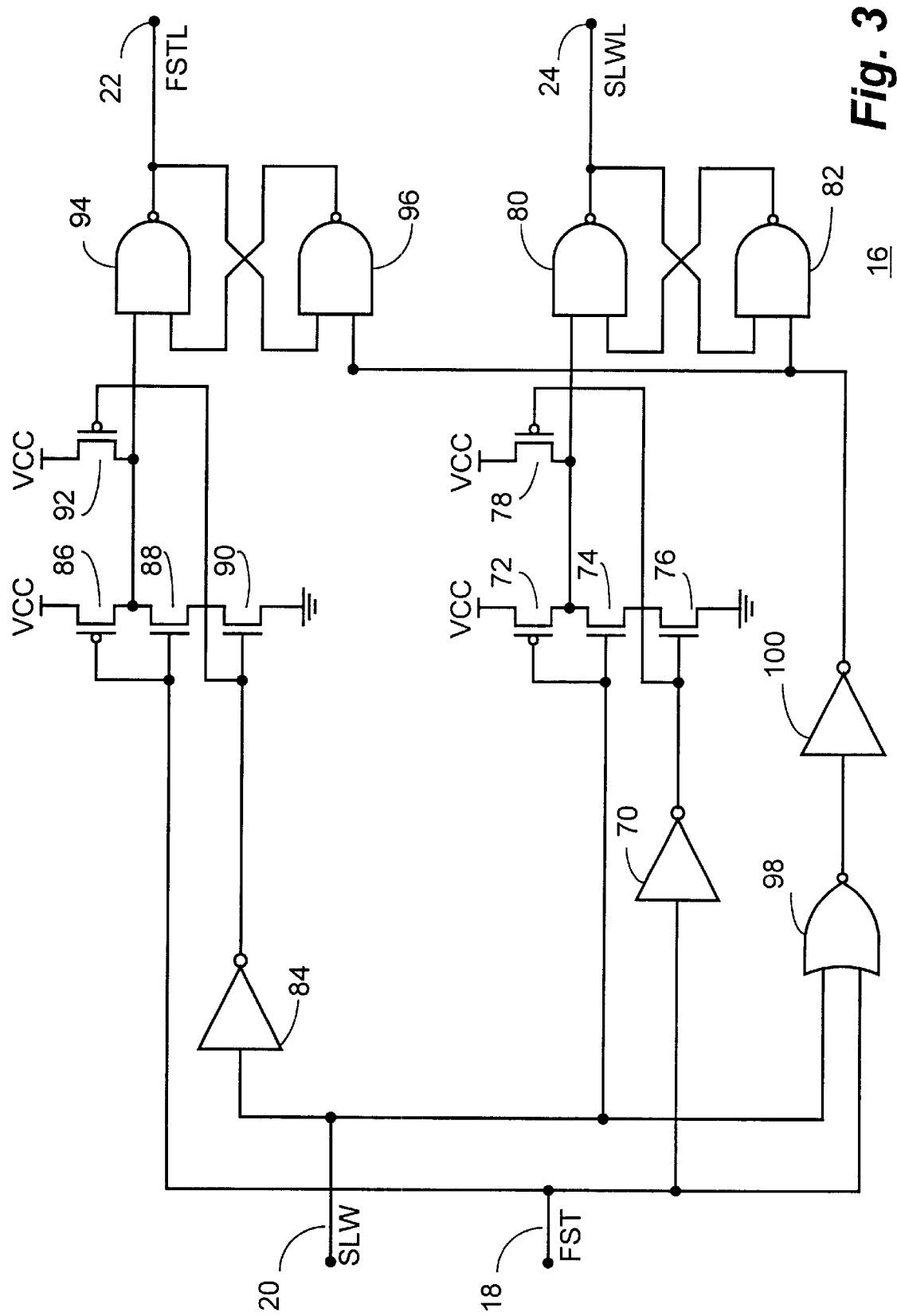
FIG. 3 is a detailed schematic diagram of an exemplary fast/slow latch circuit as illustrated in FIG. 1 for generating a latched fast signal ("FSTL") and a latched slow signal ("SLWL") from the "Go Fast" ("FST") and "Go Slow" ("SLW") respectively received from the phase detector.

With reference additionally now to FIG. 3, a detailed schematic diagram of an exemplary fast/slow latch circuit 16 is shown for use in the delay locked loop circuit 10 of FIG. 1. The fast/slow latch circuit 16 provides a latched fast signal ("FSTL") on line 22 and a latched slow signal ("SLWL") on line 24 to the delay voltage control circuit 26 from the "Go Fast" ("FST") and "Go Slow" ("SLW") signals received from the phase detector 14 on lines 18 and 20 respectively as will be more fully described hereinafter.

The FST signal on line 18 is supplied to the input of inverting amplifier 70 as shown and its output is furnished to the gate of N-channel transistor 76 forming a portion of series connected P-channel transistor 72 and N-channel transistors 74 and 76 coupled between VCC and circuit ground. The gate of N-channel transistor 76 is also coupled to the gate of P-channel transistor 78 coupled in parallel with P-channel transistor 72. The node intermediate P-channel transistor 72 and N-channel transistor 74 is coupled to one input of NAND gate 80 cross-coupled with NAND gate 82 to form a latch with the output of NAND gate 80 providing the SLWL signal on line 24.

In like manner, the SLW signal on line 20 is supplied to the input of inverting amplifier 84 as shown and its output is furnished to the gate of N-channel transistor 90 forming a portion of series connected P-channel transistor 86 and N-channel transistors 88 and 90 also coupled between VCC and circuit ground. The gate of N-channel transistor 90 is also coupled to the gate of P-channel transistor 92 coupled in parallel with P-channel transistor 86. The node intermediate P-channel transistor 86 and N-channel transistor 88 is coupled to one input of NAND gate 94 cross-coupled with NAND gate 96 to form another latch with the output of NAND gate 94 providing the FSTL signal on line 22. The FST and SLW signals on lines 18 and 20 are also provided as inputs to NOR gate 98, which has its output coupled to the input of inverting amplifier 100 which provides an input to NAND gates 82 and 96.

Figure 4A:
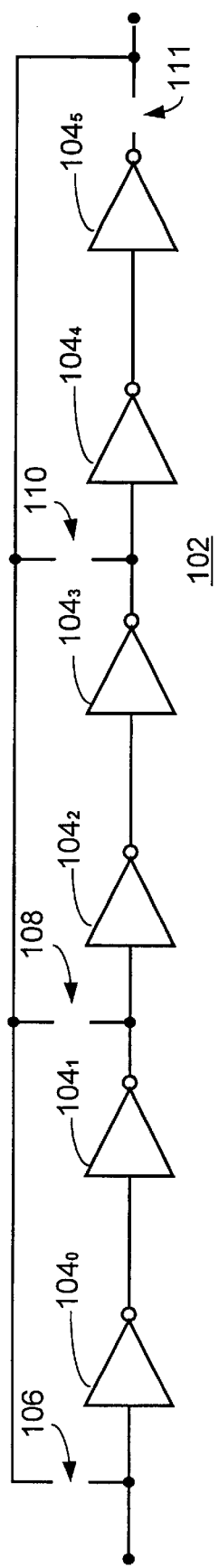
FIG. 4A is a detailed schematic diagram of a fine tuning delay line circuit forming a portion of the fixed delay line circuit illustrated in FIG. 1.

With reference additionally now to FIG. 4A, a detailed schematic diagram of a fine tuning delay line circuit 102 is shown which forms a portion of the fixed delay line circuit 36 illustrated in FIG. 1. he fine tuning delay line circuit 102 comprises a umber of series connected inverting amplifiers $104_0$ through $104_5$ which may be selectively bypassed in pairs by means a parallel bypass line having a number of predetermined shorting points, for example, fusible links or other selective electrical connection techniques. In this manner, by making connection at point 106, all of the inverting amplifiers $104_0$ through $104_5$ are effectively removed from the fixed delay line circuit 36. By making a connection at point 108, only inverting amplifiers $104_0$ and $104_1$ will be included. Similarly, by making a connection at point 110, inverting amplifiers $104_0$ through $104_3$ will be utilized.

Another fusible link at point 111 is included in the output path of the inverting amplifier $104_5$ as shown. This link will be closed when the links at points 106, 108 and 110 are open. If any of the links at points 106, 108 or 110 are closed as previously described the link at point 111 must be open to preclude inverting amplifier $104_5$ from competing with the upstream inverting amplifier.

Figure 4B:
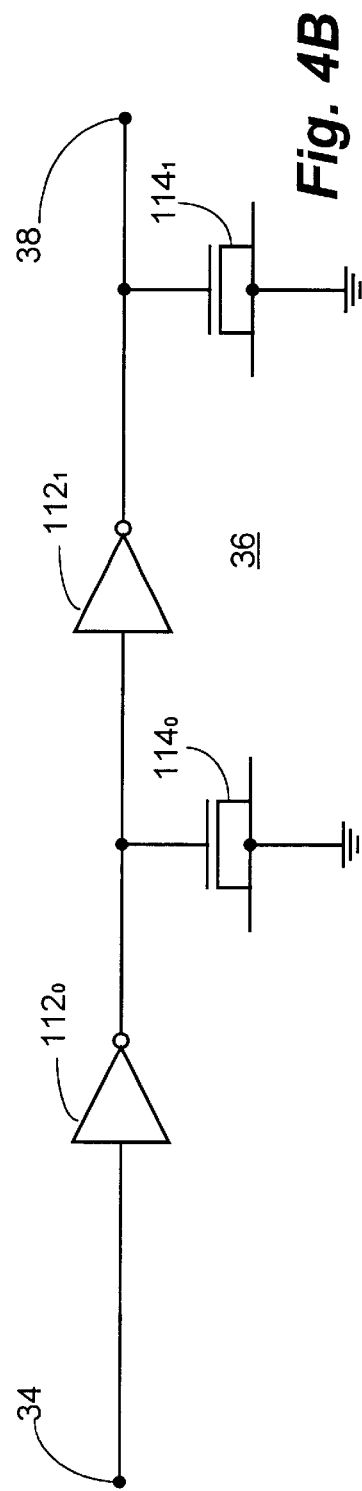
FIG. 4B is a detailed schematic diagram of a portion of the fixed delay line circuit as illustrated in FIG. 1 coupled between the voltage controlled delay line and one input of the phase detector.

With reference additionally now to FIG. 4B, a detailed schematic diagram of a portion of the fixed delay line circuit 36 as illustrated in FIG. 1 is shown. The fixed delay line circuit 36 is coupled between the voltage controlled delay line circuit 32 and one input of the phase detector 14. It comprises a pair of series connected inverting amplifiers $112_0$ and $112_1$ with an MOS capacitor $114_0$ at the output of inverting amplifier $112_0$ and a similar MOS capacitor $114_1$ at the output of inverting amplifier $112_1$. Each of the MOS transistors $114_0$ and $114_1$ couple the output of the inverting amplifiers $112_0$ and $112_1$ respectively to circuit ground.

Figure 5:
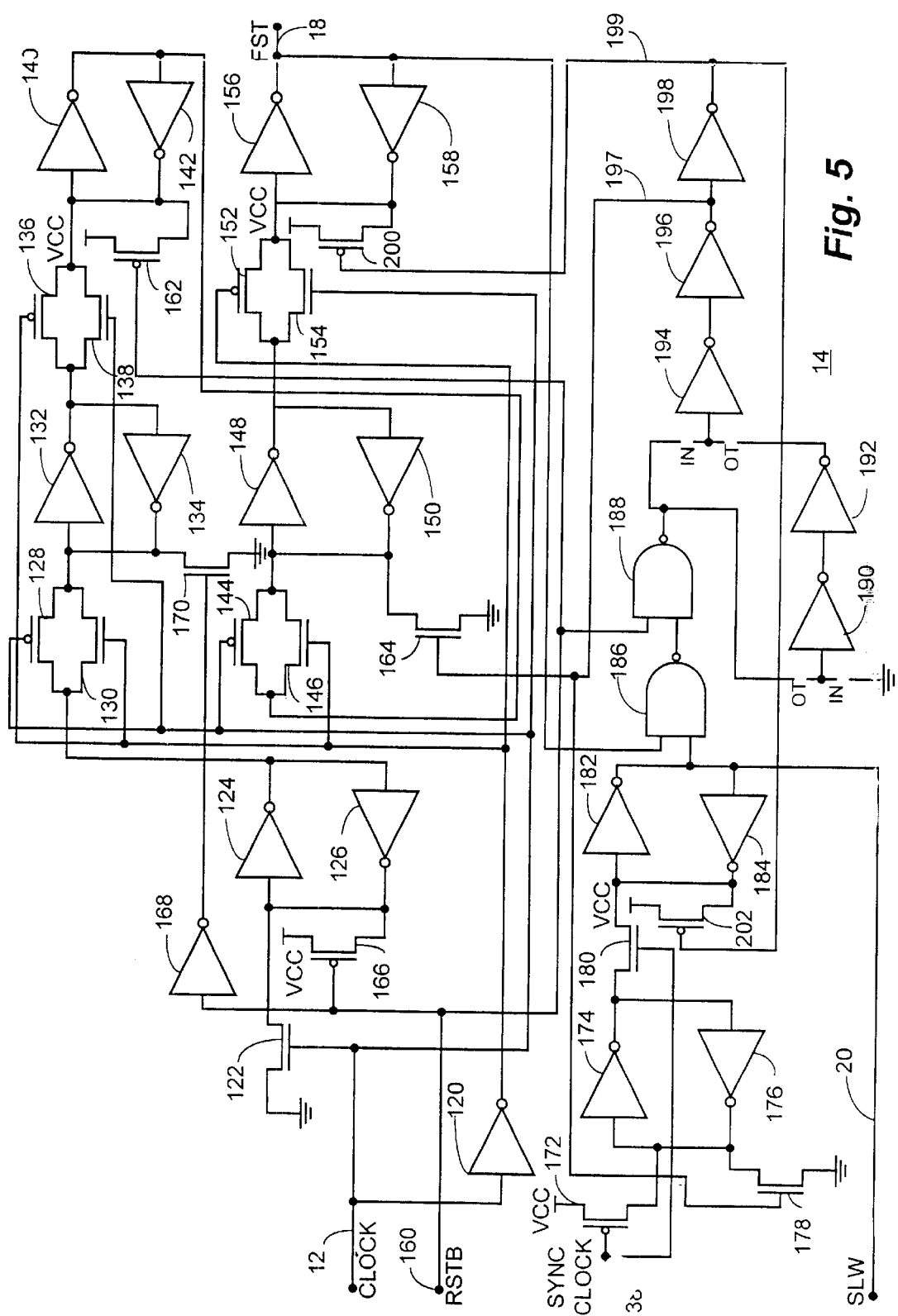
FIG. 5 is a detailed schematic diagram of an exemplary embodiment of the phase detector illustrated in FIG. 1 for generating the "Go Fast" and "Go Slow" signals to the fast/slow latch circuit in accordance with the phase relationship between a pair of clock input signals.

With reference additionally now to FIG. 5, a detailed schematic diagram of an exemplary embodiment of the phase detector 14 illustrated in FIG. 1 is shown. The phase detector 14 generates the "Go Fast" and "Go Slow" signals on lines 18 and 20 respectively to the fast/slow latch circuit 16 in accordance with the phase relationship between the clock signal on line 12 and the sync clock signal on line 38.

The "CLOCK" signal is input to the phase detector 14 on line 12 for input to an inverting amplifier 120 and the gate terminal of N-channel transistor 122 having one of its terminals coupled to the input of a latch circuit comprising cross-coupled inverting amplifiers 124 and 126 and its other terminal coupled to circuit ground. The output of the latch circuit comprising inverting amplifiers 124 and 126 is coupled to the input of parallel coupled P-channel transistor 128 and N-channel transistor 130 and then to another latch circuit comprising cross-coupled inverting amplifiers 132 and 134. The output of this latch circuit is then applied to parallel coupled P-channel transistor 136 and N-channel transistor 138 to another latch circuit comprising cross-coupled inverting amplifiers 140 and 142. The output of this latch circuit is then applied to parallel coupled P-channel transistor 144 and N-channel transistor 146 and then to the input of a latch circuit comprising cross-coupled inverting amplifiers 148 and 150. In turn, the output of this latch circuit is supplied to parallel coupled P-channel transistor 152 and N-channel transistor 154 for input to yet another latch circuit comprising cross-coupled inverting amplifiers 156 and 158.

The "Go Faster" signal "FST" is taken at line 18 at the output of inverting amplifier 156 and is also fed back as one input of two input NAND gate 186 which has its output connected to one input of two input NAND gate 188 as shown. A reset "bar" ("RSTB") signal on line 160 is supplied to the gate of P-channel transistor 162 which has one terminal thereof coupled to VCC and the other coupled to the input of the latch comprising inverting amplifiers 140 and 142. The RSTB signal is also supplied to the gate of P-channel transistor 166 coupling VCC to the input of the latch comprising inverting amplifiers 124 and 126 as well as to the input of inverting amplifier 168. The output of inverting amplifier 168 is supplied to the gate terminal of N-channel transistor 170 coupling the input of the latch comprising inverting amplifiers 132 and 134 to circuit ground. The RSTB signal is also supplied as a second input to two input NAND gate 188.

The SYNC CLOCK signal on line 38 is supplied to the gate of P-channel transistor 172 which has one terminal thereof coupled to VCC and the other to the input of a latch comprising cross-coupled inverting amplifiers 174 and 176. The input of this latch circuit is coupled to circuit ground through N-channel transistor 178 and its output is coupled through N-channel transistor 180 to the input of another latch circuit comprising cross-coupled inverting amplifiers 182 and 184. The gate of N-channel transistor 180 is coupled to line 38. A P-channel transistor 202 couples the input of the latch circuit comprising inverting amplifiers 182 and 184 to VCC as shown.

The output of the latch circuit comprising inverting amplifiers 182 and 184 is coupled to the second input of NAND gate 186. The output of NAND gate 188 is coupled to a string of inverting amplifiers by means of a number of selectable links such that inverting amplifiers 190 and 192 may (or may not) be placed in series before inverting amplifiers 194, 196 and 198 as a matter of design choice in the particular implementation of the phase detector 14 shown. The output of inverting amplifier 196 on line 197 is supplied to the gate of N-channel transistor 164 coupling the input of the latch comprising inverting amplifiers 148 and 150 to circuit ground. The signal on line 197 is also supplied to the gate of N-channel transistor 178. The output of inverting amplifier 198 on line 199 is coupled to the gate terminals of P-channel transistors 200 and 202, the former coupling the input of the latch comprising inverting amplifiers 156 and 158 to VCC and the latter coupling the input of the latch comprising inverting amplifiers 182 and 184 to VCC. The "Go Slower" signal "SLW" on line 20 is taken at the output of the latch circuit comprising inverting amplifiers 182 and 184.

In the embodiment of the present invention disclosed in the preceding figures, the first two reference clock pulses on the CLOCK line 12 are effectively ignored by the phase detector 14 through the provision of at least one shift-register stage consisting of two transmission gates comprising P-channel transistors 128, 136; N-channel transistors 130, 138 and the latches made up of inverting amplifiers 132, 134, 140 and 142. This results in a programmable delay after power up or resetting before the state of the FST signal can change state, thus ensuring that the initial decision will be to "go slow", that is, the SLW signal will change state first. Under most operating conditions, the delay line will continue to go slower even after the FST signal changes state. This is advantageous because technology limits the minimum delay that can be achieved through the delay line. Therefore, the voltage controlled delay elements can be slowed down to a much greater extent than they can be speeded up from their initial delay.

In operation, the phase detector 14 outputs are logically exclusive OR'd ("XOR") then latched by the fast/slow latch circuit 16 providing clean digital speed up ("FSTL" on line 22) or slow down ("SLWL" on line 24) signals to the delay voltage control circuit 26. By eliminating the conventional overlap of these inputs to the delay voltage control circuit 26, only one directional change (i.e. "speed up" or "slow down") occurs per cycle. This eliminates the potential for excessive, or wasted, current consumption which may be caused when overlapping signals are used while also allowing the control voltages to be driven all the way to VCC or circuit ground levels.

While there have been described above the principles of the present invention in conjunction with specific circuit implementations and exemplary applications, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. A delay locked loop circuit comprising:
   a phase detector coupled to receive first and second clocking signals and to produce a go-faster signal and a go-slower signal indicative of a phase relationship between said first and second clocking signals, wherein said phase detector includes a delay operable to delay said first clocking signal such that initially after power up or resetting the delay locked loop circuit, said phase detector determines said second clocking signal is received prior to said first clocking signal;
   a latch circuit coupled to receive said go-faster and go-slower signals and to produce a latched go-fast signal or a latched go-slow signal in response thereto, whereby after power up or resetting the delay locked loop circuit said latch circuit first produces said latched go-slow signal; and
   a voltage controlled delay line coupled to receive said latched go-fast and go-slow signals, said voltage controlled delay line producing said second clocking signal for input to said phase detector based on said received signals.

2. The delay locked loop circuit of claim 1 further comprising:
   a delay voltage control circuit coupled intermediate said latch circuit and said voltage controlled delay line.

3. The delay locked loop circuit of claim 1 further comprising:
   a fixed delay line coupled to said voltage controlled delay line for adding a fixed delay to said second clocking signal produced by said voltage controlled delay line.

4. The delay locked loop circuit of claim 1 wherein said latch circuit includes a logic circuit for processing said go-faster and go-slower signals such that said latched go-fast and latched go-slow signals are mutually exclusive on a per cycle basis.

5. The delay locked loop circuit of claim 1 wherein said latch circuit provides a variable control pulse for said latched go-fast and go-slow signals for providing a variable change thereon to said voltage controlled delay line as determined by a magnitude of a phase difference between said first and second clocking signals, wherein said variable change decreases in magnitude as the phase difference decreases.

6. The delay locked loop circuit of claim 1, wherein the delay comprises at least one shift-register stage.

7. The delay locked loop circuit of claim 6, wherein the delay includes a flip-flop delay stage.

8. The delay locked loop circuit of claim 6, wherein the delay includes at least two shift register stages such that said first clock signal is delayed by at least two pulses.

9. A method for operating a delay locked loop comprising:
   inputting a first clock signal;
   comparing a phase of said first clock signal to a phase of a second clock signal, wherein said comparing includes providing a delay to said first clock signal after a reset or power up of said delay locked loop;
   producing at least one output signal indicative of a phase relationship between said first and second clock signals;
   latching said at least one output signal to provide either a latched go-slower or a latched go-faster signal in response thereto; and
   controlling a delay line in response to said mutually exclusive latched go-slower and go-faster signals to produce said second clock signal.

10. The method of claim 9 further comprising the step of:
    controlling a voltage of said mutually exclusive latched go-slower and go-faster signals prior to said step of controlling said delay line.

11. The method of claim 9 wherein said step of producing at least one output signal comprises the step of:
    producing separate "fast" and "slow" signals prior to said step of latching said at least one output signal.

12. The method of claim 11 wherein said delay of said step of comparing is selected to have a duration such that said step of comparing includes:
    ignoring at least a first pulse of said first clocking signal; and
    producing said at least one output signal to be indicative of a "slow" condition of said phase locked loop prior to said step of latching said at least one output signal.

13. The method of claim 9 wherein said step of latching comprises the step of:
    producing said mutually exclusive latched go-slower and go-faster signals on a per cycle basis of said first clock signal.

14. The method of claim 9 wherein said step of latching said at least one output signal comprises the steps of:
    providing a variable control pulse for said latched go-slower and go-faster signals; and
    producing a change in said latched go-slower and go-faster signals of decreasing duration for providing a decreasing magnitude change thereon to said voltage controlled delay line as determined by a magnitude of a phase difference between said first and second clock signals prior to said step of controlling said delay line.

15. A delay locked loop circuit for use in an integrated circuit, comprising:
    a phase detector coupled to receive a reference clock signal and a synchronization clock signal, wherein the synchronization clock signal comprises the reference clock signal after being delayed by a voltage controlled delay line and wherein the phase detector produces a go-faster signal and a go-slower signal; and
    a fast-slow latch for receiving the go-faster and the go-slower signals each cycle and mutually exclusively producing each cycle either a latched go-faster signal indicating delay should be incrementally reduced or a latched go-slower signal indicating delay should be incrementally increased in the voltage controlled delay line to reduce a magnitude of a phase difference detected by the phase detector, whereby duration of the latched go-faster and go-slower signals decreases with each cycle as the magnitude of the detected phase difference decreases;
    wherein the phase detector produces the go-slower signal when detecting the synchronization clock signal arriving first and the go-faster signal when detecting the reference clock signal arriving first and further wherein the phase detector includes a circuit for, after reset or power up of the delay locked loop circuit, delaying the reference clock signal such that the synchronization clock signal is detected first and the go-slower signal is produced.

* * * * *